(12) United States Patent
Cho

(10) Patent No.: US 6,191,709 B1
(45) Date of Patent: Feb. 20, 2001

(54) KEYBOARD WITH SEPARATED KEYBOARD FRAMES AND PORTABLE COMPUTER HAVING THE SAME

(75) Inventor: Hwan-Cheol Cho, Suwon (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/092,986

(22) Filed: Jun. 8, 1998

Related U.S. Application Data

(63) Continuation-in-part of application No. 08/799,024, filed on Feb. 10, 1997, now abandoned.

(30) Foreign Application Priority Data

Feb. 9, 1996 (KR) .................................................. 96-3185

(51) Int. Cl.[7] .................................................. H03M 11/00
(52) U.S. Cl. ...................... 341/26; 340/825.79; 345/168; 708/142
(58) Field of Search .................. 341/20, 22, 26, 341/25; 708/142; 345/1, 168; 340/825.03, 825.79

(56) References Cited

U.S. PATENT DOCUMENTS

| | | | |
|---|---|---|---|
| 3,940,758 | 2/1976 | Margolin | 345/169 |
| 4,739,310 | 4/1988 | Yamamoto | 341/25 |
| 4,847,799 | 7/1989 | Morita et al. | 708/142 |
| 5,136,694 | 8/1992 | Belt et al. | 710/67 |
| 5,144,302 | 9/1992 | Carter et al. | 341/20 |
| 5,208,683 | 5/1993 | Okada | 358/468 |
| 5,278,958 | 1/1994 | Dewa | 710/16 |
| 5,323,153 | 6/1994 | Sonobe et al. | 341/20 |
| 5,341,316 | 8/1994 | Nishigaki | 708/142 |
| 5,402,121 | 3/1995 | Noorbebesht | 341/26 |
| 5,410,305 | 4/1995 | Barrus et al. | 341/22 |
| 5,412,586 | 5/1995 | Oldfather | 708/142 |
| 5,414,421 | 5/1995 | Vernon et al. | 341/22 |
| 5,576,706 | 11/1996 | Daigle et al. | 341/72 |
| 6,005,496 | * 12/1999 | Hargreaves et al. | 341/22 |

* cited by examiner

Primary Examiner—Michael Horabik
Assistant Examiner—Albert K. Wong
(74) Attorney, Agent, or Firm—Robert E. Bushnell, Esq.

(57) ABSTRACT

A keyboard with a simplified structure, which is connected to a main computer having a microcomputer in which a key map is stored therein and which generates first and second scanning signals via respective scan input lines and receives first or second scanning codes via respective scan output lines upon a key on the keyboard being operated. The keyboard includes first and second keyboard frames separated from each other, and a first key matrix assigned to the first keyboard frame and disposed adjacent thereto, for generating the first scanning code in response to the first scanning signal, and a second key matrix assigned to the second keyboard frame and disposed adjacent thereto, for generating the second scanning code in response to the second scanning signal.

13 Claims, 8 Drawing Sheets

Fig. 3

| | | | | | | | | |
|---|---|---|---|---|---|---|---|---|
| 13 | 5 | X | C | | | | | |
| 1 | F6 | T | B | CAPS LOCK | | | | |
| 16 | F5 | G | V | | | | | |
| 18 | F4 | F | R | Z | | | | |
| 17 | F3 | 4 | E | D | | | | |
| 5 | F2 (F12) | 3 | W | S | | | | |
| 2 | F1 (F11) | 2 | Q | A | | | | |
| 3 | ESC | 1 | TAB | ~ | SHIFT | Fn | CTRL | ALT |
| | 15 | 4 | 6+14 | 7+12 | 9 | 8 | 10 | 11 |

Fig. 4

| | | | | | | |
|---|---|---|---|---|---|---|
| 18 | . | > | PgDn | = | BACK | |
| 15 | [ | → | PgUp | End | | Win Logo |
| 14 | - | ↓ | Home | \ | ENTER | ↑ |
| 13 | DEL | ← | INS | P | : | / |
| 1 | PAUSE | 7 | PrtSc | 8 | 9 | 0 |
| 2 | Appl Logo | Y | | I | O | L |
| 3 | F10 | F7 | F9 | U | J | K |
| 11 | F8 | 6 | H | N | M | < | SHIFT | ALT | CTRL |
| | 4 | 8 | 17 | 5 | 6 | 7+16 | 12 | 10 | 9 |

Fig. 5

| KS0 | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| 1 | ESC | X | TAB | ~ | L. SHIFT | Fn | L. CTRL | L. ALT | . | > | PgDn | = | BACK | Win Logo |
| 2 | F2 (F12) | T | B | CAPS LOCK | | | | | [ | ↑ | PgUp | End | | ← |
| 3 | F1 (F11) | 3 | W | S | | | | | - | → | Home | \ | ENTER | / |
| 4 | F3 | 4 | E | D | | | | | DEL | ↓ | INS | P | : | 0 |
| 5 | F4 | F | R | Z | | | | | PAUSE | 7 | PrtSc | 8 | 9 | L |
| 6 | F5 | G | V | | | | | | Appl Logo | Y | | I | O | K |
| 7 | F6 | T | B | CAPS | R. SHIFT | | R. CTRL | R. ALT | F10 | F7 | F9 | U | J | V |
| 8 | 5 | X | C | | | | | | F8 | 6 | H | N | M | V |

KEYBOARD WITH SEPARATED KEYBOARD FRAMES AND PORTABLE COMPUTER HAVING THE SAME

CROSS-REFERENCE TO RELATED APPLICATIONS

This application is a continuation-in-part of Applicant's Ser. No. 08/799,024, filed in the U.S. Patent & Trademark Office on Feb. 10, 1997 now abandoned.

CLAIM OF PRIORITY

This application makes reference to, incorporates the same herein, and claims all benefits accruing under 35 U.S.C. §119 and §120 from an application entitled Keyboard with Separated Keyboard Frames and Portable Computer Having the Same earlier filed in the Korean Industrial Property Office on Feb. 9, 1996, and there duly assigned Ser. No. 96-3185 by that Office.

BACKGROUND OF THE INVENTION

1. Field of the Invention

The present invention relates to a keyboard with separated keyboard frames and a portable computer system having the same, and more particularly to a keyboard having at least two separated keyboard frames with a key matrix assigned respectively thereto, which generates key scanning codes in response to key entries, and a portable computer having the same.

2. Description of the Related Art

In general, a keyboard is a major device for data entry, and has a plurality of keys to provide easy data entry. Typically, a keyboard has a keyboard frame, a key matrix connected thereto and a keyboard controller for managing the general operation of the keyboard. The keyboard controller, generally, consists of a microcomputer. The steps of processing key entry are as follows:

The keyboard controller periodically checks whether any key entry has taken place by scanning the key matrix. Once perceiving a key entry, the keyboard controller transfers a scanning code assigned to the pressed key to a computer system. That is, the keyboard controller generates a scanning signal (pulse signal) and provides it to an input of the key matrix and determines whether a key has been pressed by receiving the corresponding output from an output of the key matrix. A usual keyboard mounted on a portable computer is also operated in the same way as described above.

However, most of the above-mentioned keyboards have a single frame (or a single keypad) in its structure, which is not suitable for an input device, such as a keyboard for repeated key inputs. Especially, such a keyboard having a single frame is still less suitable for a portable computer. In the case of a personal desk top computer, in order to solve such a problem, a keyboard having several keyboard frames which are separated from each other is currently being used.

Such a keyboard includes first and second frames which are separated from each other and first and second matrices respectively assigned thereto. A matrix cable connects the first key matrix to the second key matrix and a keyboard controller. The operation of the keyboard having separate keyboard frames is performed in the same manner as a keyboard having a single keyboard frame. That is, the key controller generates scanning signals which are provided through the first key matrix to the second key matrix. The transfer of the scanning signals from one key matrix to the other key matrix is accomplished by the matrix cable connected therebetween. If there is a key entry through the first keyboard frame, a scanning code generated by the first keyboard frame is supplied through the matrix cable via the second key matrix to the keyboard controller. The keyboard controller then generates a key input signal corresponding to the entry key and the key input signals are serially transmitted to a microcomputer embodied in the computer system. Alternatively, if there is a key entry through the second keyboard frame, a scanning code generated by the second keyboard frame is supplied to the keyboard controller which generates a key input signal in the same manner as with the first keyboard frame.

In case of connecting such a keyboard to a portable computer, however, it is complicated to connect two separated key matrices to each other by using a matrix cable. Besides, it is difficult to locate a keyboard having a matrix cable within a limited space of a portable computer body. Since the keyboard also has a keyboard controller and several circuits, its structure is suitable for, for example, a desktop or tower computer system whose computer body is separated from the keyboard, but not for a portable computer system.

Specifically, since the keyboard has a keyboard controller consisting of a microprocessor or a microcomputer, the product cost thereof is relatively high, as compared to a keyboard which does not require a keyboard controller.

The patent to Margolin, U.S. Pat. No. 3,940,758, entitled EXPANDABLE KEYBOARD FOR ELECTRONIC POCKET CALCULATORS AND THE LIKE, discloses a keyboard having three frames 11–13 which are each separately connected to a computer circuit 20.

The patent to Morita et al., U.S. Pat. No 4,847,799, entitled KEYBOARD APPARATUS HAVING SEPARATE WORKING AREAS WITH THUMB-OPERATED SHIFTING OF KEY FUNCTIONS, discloses a keyboard having two frames which are both separately connected to a microprocessor 6 via an input port 5.

The patent to Okada, U.S. Pat. No. 5,208,638, entitled FACSIMILE APPARATUS, discloses a facsimile apparatus in which a ten-keypad and a plurality of one-touch keys are separately connected to a central processing unit via two respective interface units.

The patent to Vernon et al, U.S. Pat. No. 5,214,421, entitled AUTOMATIC KEYBOARD AND MONITOR SWITCHING DEVICE, discloses an arrangement in which two separate keyboards are alternatively connected to the central processing unit of a personal computer.

While each of the aforecited patents each disclose features in common with the present invention, none of these patents teach or suggest a keyboard having a plurality of keyboard frames and a plurality of key matrices respectively assigned thereto, as recited in the present claims, thereby obviating the need for a keyboard controller and a matrix cable for the keyboard.

SUMMARY OF THE INVENTION

It is therefore an object of the present invention to provide a keyboard having a simplified structure using a microcomputer provided in a portable computer.

It is a further object of the present invention to provide a keyboard having separated keyboard frames which is capable of being easily mounted on a portable computer.

It is another object of the present invention to provide a keyboard suitable for a portable computer.

According to an aspect of the present invention, a keyboard is connected to a main computer having a microcomputer having a key map implemented therein and which generates first and second scanning signals via respective scan output lines and receives first or second return address signal via respective scan inputs lines upon a key on said keyboard being operated. The keyboard has first and second keyboard frames separated from each other; and a first key matrix assigned to said first keyboard frame and disposed adjacent thereto, for generating said first return address signal response to said first scanning signal; and a second key matrix assigned to said second keyboard frame and disposed adjacent thereto, for generating said second return address signal in response to said second scanning signal.

According to another aspect of the present invention, a computer system has a main body for performing a data processing function; a keyboard for receiving a key input signal; a microcomputer contained within said main body, having a key map implemented therein and which generates first and second scanning signals via respective scan output lines and receives first or second return address signal via respective scan input lines upon a key on said keyboard being operated; said keyboard having first and second keyboard frames separated from each other and first and second key matrices respectively assigned to said first and second keyboard frames and respectively disposed adjacent thereto, for generating said first and second return address signal in response to said first and second scanning signals.

In the keyboard of the present invention, since the two key matrices are connected independently to the microcomputer embodied in the portable computer, the computer can recognize a key entry through the keyboard without the use of any matrix cable. The scanning signals generated by the microcomputer are provided to the key matrices of the keyboard, and then the return address signal from the key matrices are provided to the microcomputer. Thus, the microcomputer receives the return address signal so that it can recognize a key entry in accordance with the key map implemented therein. Accordingly, since the keyboard of the present invention has no need to use a keyboard controller or a matrix cable therein, it has a more simplified structure. The keyboard also is suitable for and can be mounted easily on a portable computer because of its simplified structure.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3 and 4 show key maps of first and second matrices respectively assigned to first and second keyboard frames of the novel keyboard shown in FIG. 2;

FIG. 5 shows an example of a combined key map when the respective matrices of FIGS. 3 and 4 are combined with each other;

DETAILED DESCRIPTION OF PREFERRED EMBODIMENT

Figure 1:
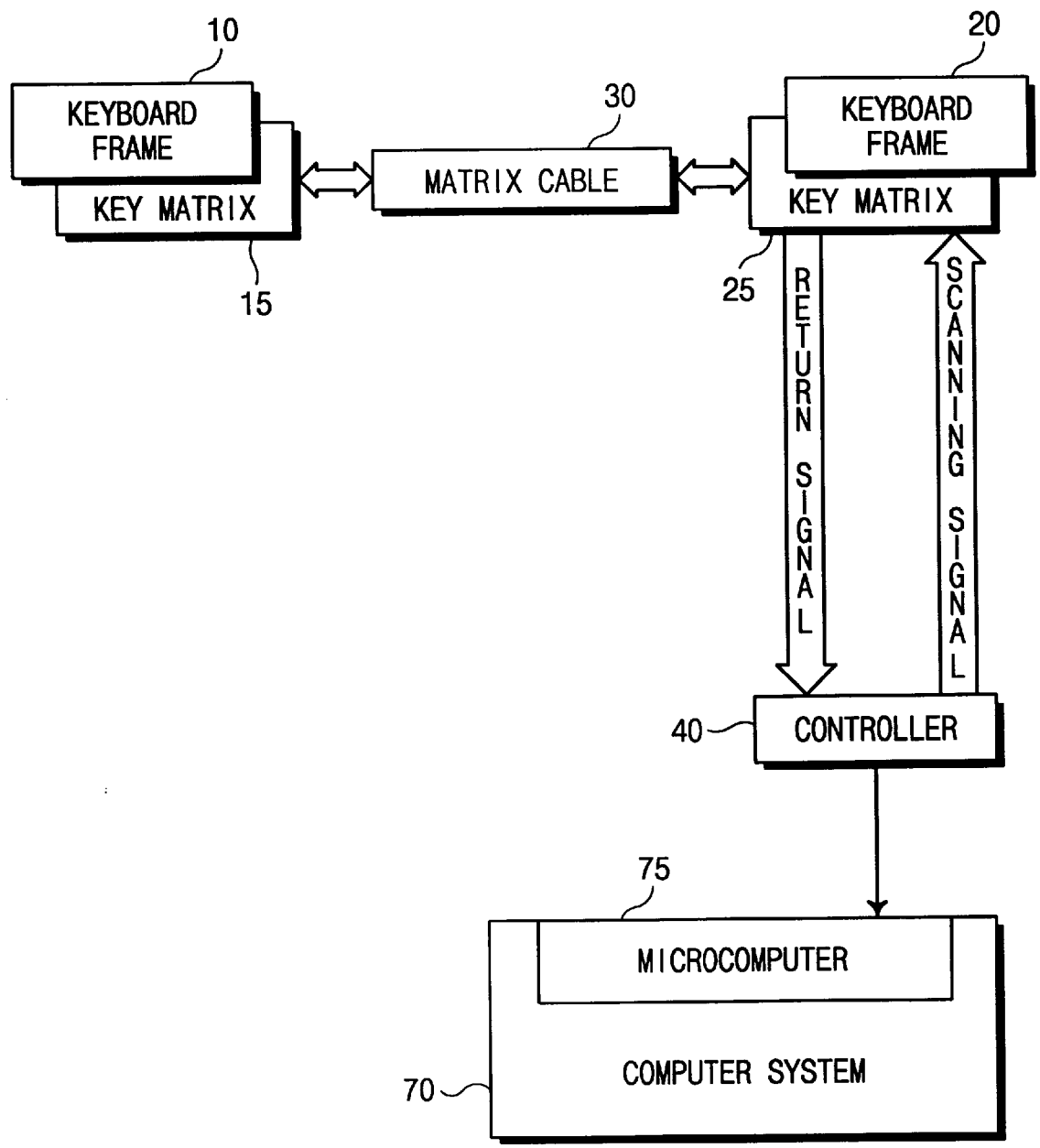
FIG. 1 illustrates, in block diagram form, the circuit construction of an earlier keyboard.

FIG. 1 is a block diagram showing the circuit construction of an earlier keyboard. As shown in FIG. 1, the keyboard includes first and second frames 10 and 20 separated from each other, first and second matrices 15 and 25 assigned thereto, respectively, a matrix cable 30 which is provided to connect the first key matrix 15 to the second key matrix 25, and a keyboard controller 40. The operation of the keyboard having separated keyboard frames is performed in the same manner as a keyboard having a single keyboard frame.

In detail, the keyboard controller 40 generates scanning signals, which are provided through the first key matrix 15 to the second key matrix 25. Transfer of the scanning signals from the first key matrix 15 to the second key matrix 25 is accomplished by the matrix cable 30 connected therebetween. If there is a key entry through the first keyboard frame 10, a return address signal by the first keyboard frame 10 is supplied through the matrix cable 30 via the second key matrix 25 to the keyboard controller 40. Then, the controller 40 generates a scanning code corresponding to the key entry. The scanning code is serially transmitted to a microcomputer 75 embodied in a computer system 70. The microcomputer 75 can recognize the scanning code. The microcomputer 75 also is provided to control several function for the computer system.

Additionally, if there is a key entry through the second keyboard frame 20, a return address signal generated by the second keyboard frame 10 is supplied to the keyboard controller 40. Then, the controller 40 generates a scanning code in the same manner as described above. The scanning code is serially transmitted to the microcomputer 75 embodied in a computer system 70. The microcomputer 75 can recognize the scanning code.

Figure 2:
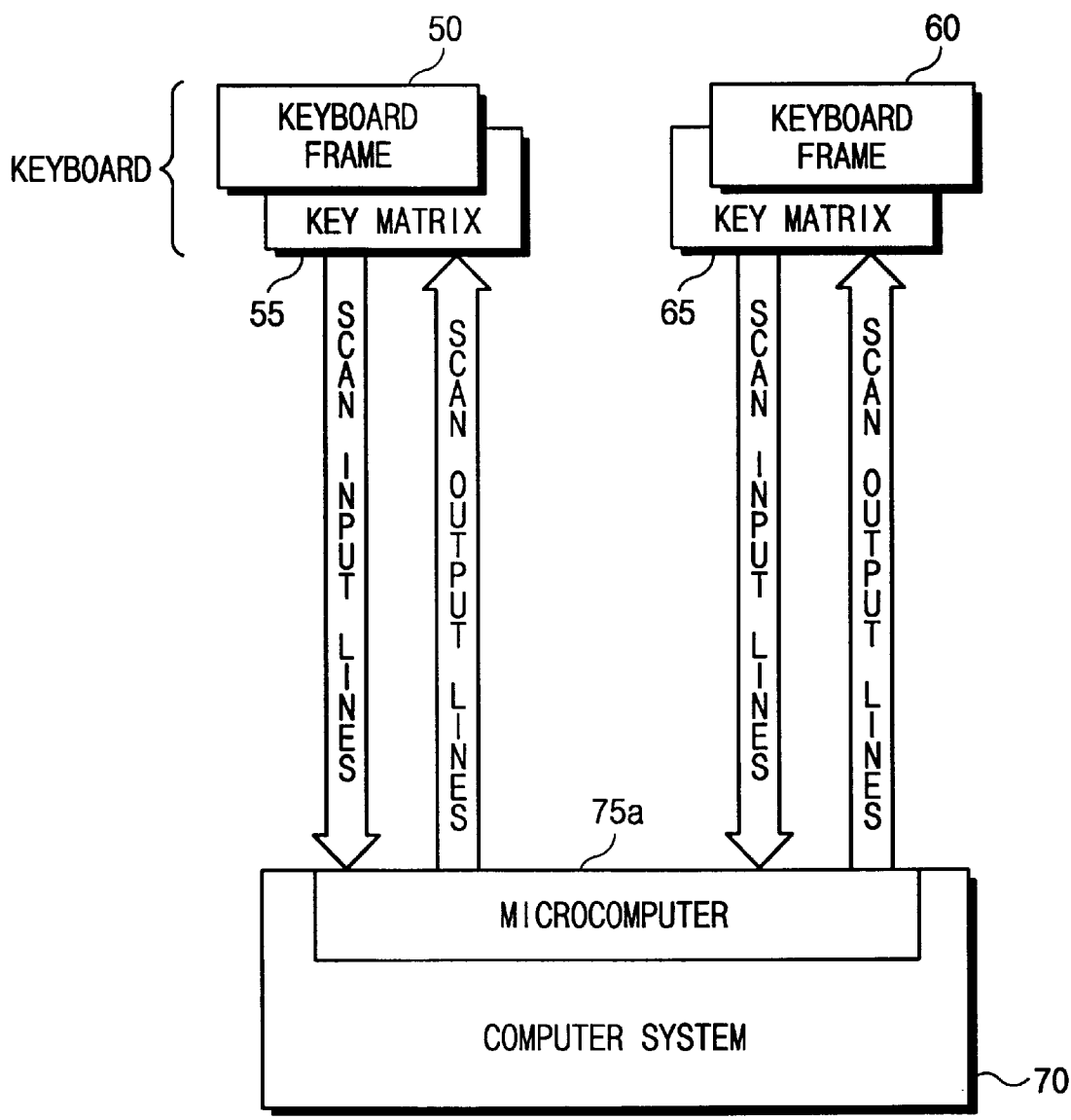
FIG. 2 illustrates, in block diagram form, the connection of a novel keyboard to a portable computer system according to the present invention.

Referring to FIG. 2, a novel keyboard in accordance with the present invention has first and second keyboard frames 50 and 60 positioned in right and left directions and first and second key matrices 55 and 65 respectively assigned thereto. The keyboard is connected to a microcomputer 75a which is provided in a main body of a computer system 70 to control several functions, such as a timer, power management and the like. The main body performs a data processing function. The microcomputer 75a is connected to the key matrices 55 and 65 by respective scan input and output lines and generates key scanning signals and receive return address signal from the key matrices 55 and 65, so that it can recognize a key entry through the keyboard. The microcomputer 75a is also provided with a memory (not shown), in which a key map is saved or implemented. The key map consists of two separated key maps which are respectively assigned to the two key matrices 55 and 65. Each of the key matrices 55 and 65 has an independent input and output structure, whose input terminal receives a scanning signal from the scan output lines and whose output terminal provides a return address signal to the scan input lines. For example, the key matrix 55 receives a scanning signal generated by the microcomputer 75a and generates a return address signal corresponding to a key entry through the first keyboard frame 50. The key matrix 65 receives another scanning signal generated by the microcomputer 75a and generates another return address signal corresponding to a key entry through the second keyboard frame 60.

Examples of the two key maps assigned respectively to the first and the second key matrices 55 and 65 are shown in FIGS. 3 and 4. The two key maps are combined with each other to form a combined key map as shown in FIG. 5. The combined key map is saved in the memory (not shown) in the microcomputer 75a.

The key entry operation of the keyboard is as follows.

Referring again to FIG. 2, the microcomputer 75a periodically generates scanning signals. The scanning signals are respectively supplied to the first and second key matrices 55 and 65. Then, if there is a key entry through either of the keyboard frames 50 and 60, the corresponding key matrix generates a key return address signal. The microcomputer 75a embodied in the computer system 70 receives the key return address signal and recognizes the key entry in accordance with the key map therein.

Figure 6:
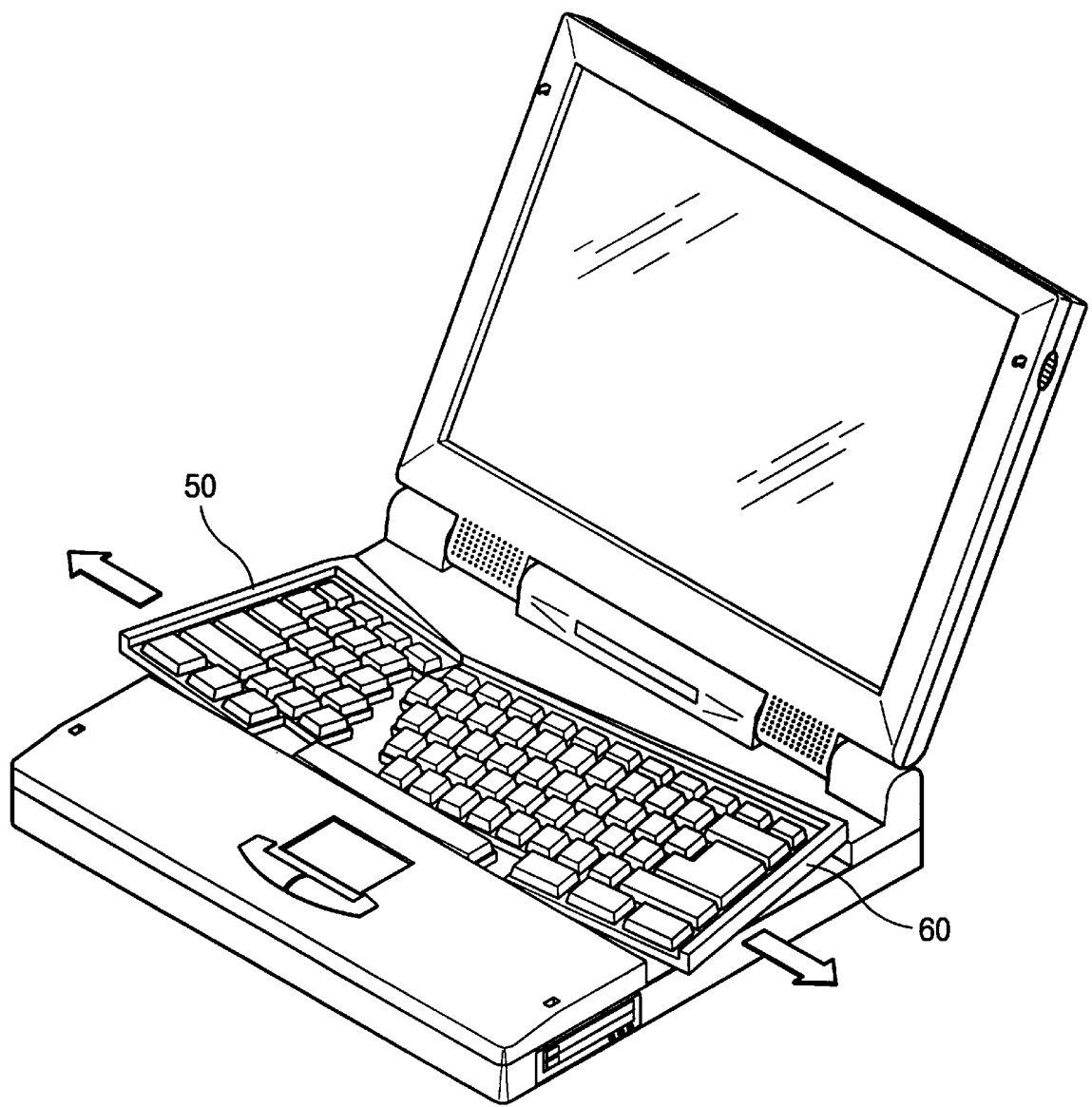
FIG. 6 is a perspective view of a computer system to which the novel keyboard of FIG. 2 is adapted.
Figure 7A:
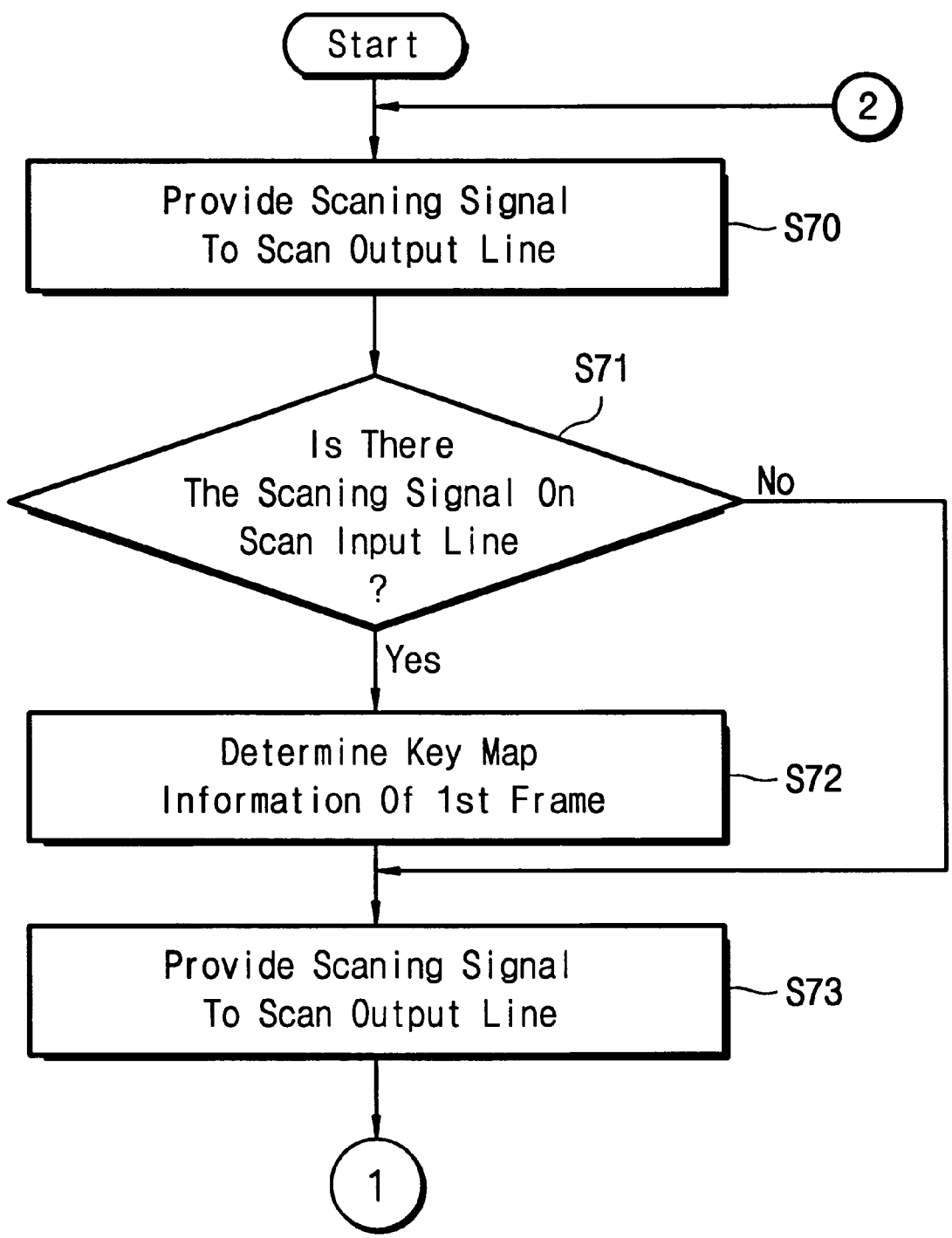
FIGS. 7A and 7B together form a flowchart showing the method for detecting a key entry on the keyboard of FIG. 2.
Figure 7B:
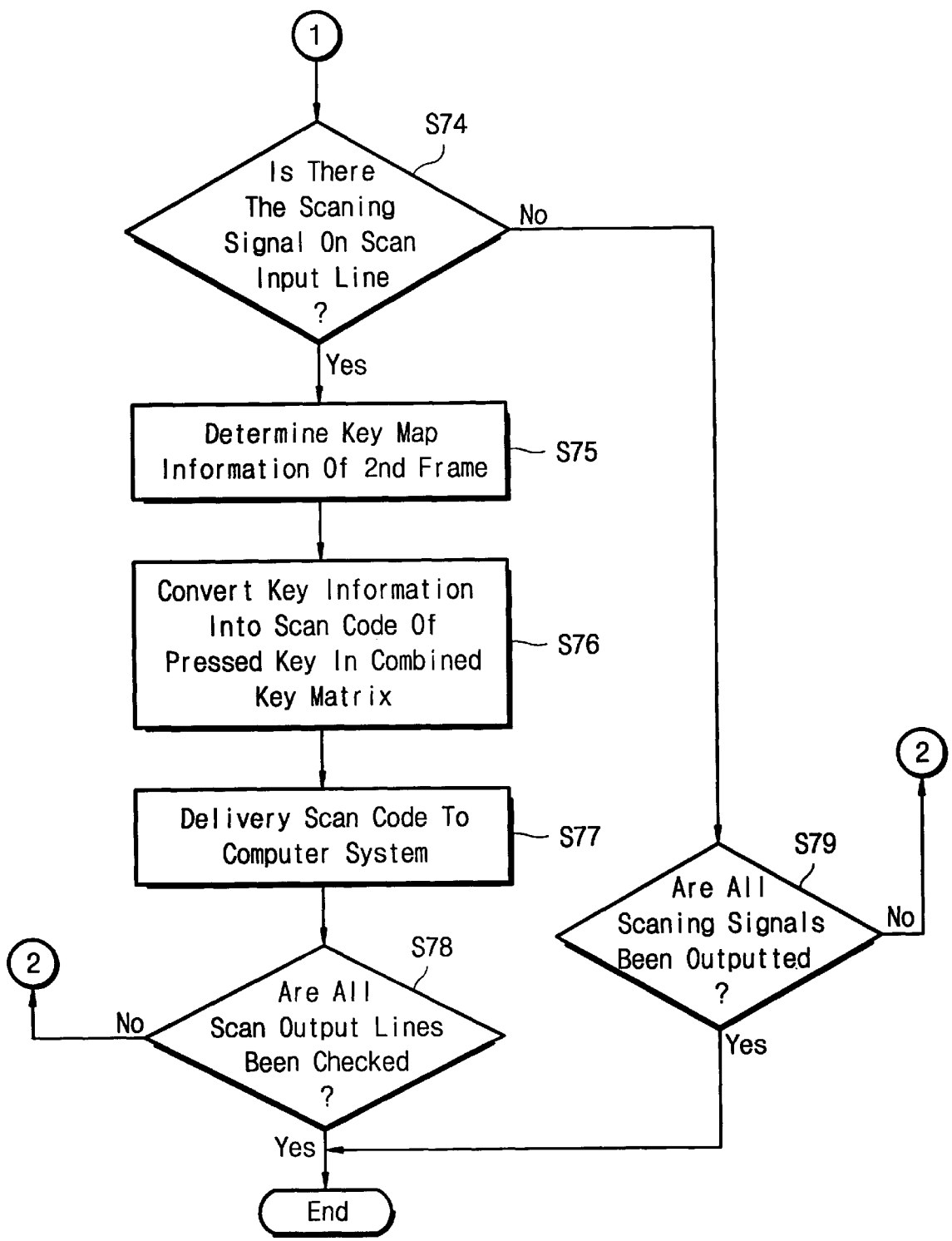

FIG. 6 is a perspective view of a computer system to which the novel keyboard having two separated keyboard frames shown in FIG. 2 is adapted. FIGS. 7A and 7B together form a flowchart showing a method for detecting a key entry on the keyboard of FIG. 2.

Referring now to FIG. 6, the keyboard suitable for a portable computer is divided into two parts, first and second keyboard frames 50 and 60. To separate the keyboard, the keyboard frames 50 and 60 are slid to the left and right side, respectively as shown by the arrows of FIG. 6. To combine the keyboard, the keyboard frames 50 and 60 are closed manually or may be automatically closed by closing the LCD panel. The key matrices 55 and 65 of the separated keyboard frames 50 and 60 respectively correspond to the key maps shown in FIGS. 3 and 4. A memory of the microcomputer 75a (refer to FIG. 2) stores a combined key map of FIG. 5, in addition to the key maps of FIGS. 3 and 4. It is to be noted that the keyboard of the present invention adapted to a portable computer does not have a keyboard controller, e.g., a microcomputer or a microprocessor.

Hereinafter, a method for detecting a key entry on the keyboard will be described with reference to FIGS. 7A and 7B. The method is performed under the control of the microcomputer 75a.

Referring to FIGS. 2 and 7A and 7B, at step S70, the microcomputer 75a of FIG. 2 generates a scanning signal, for example, a low (or "0") signal and provides it to the key matrix 55 through the scan output lines in turn. If a key of a corresponding scan output line is pressed, the scanning signal of a low level is provided through a corresponding scan input line to the microcomputer 75a. The control proceeds to step S71 where it is determined whether or not there is the scanning signal on the scan input line connected to the key matrix 55. Next, key map information concerning a key pressed on the key matrix 55 is determined at step S72 using the key map of FIG. 3.

At step S73, the microcomputer 75a generates a scanning signal of a low level and provides it to the key matrix 65 through the scan output lines in turn. If a key of a corresponding scan output line is pressed, the scanning signal of a low level is provided through a corresponding scan input line to the microcomputer 75a. The control proceeds to step S74 of FIG. 7B where it is determined whether or not there is the scanning signal on the scan input line connected to the key matrix 65. Next, if the scanning signal is on the scan input line connected to the key matrix 65, the control proceeds to step S75 where key map information concerning a key pressed on the key matrix 65 is determined using the key map of FIG. 4. At step S74, if not, the control proceeds to step S79 where it is determined whether or not all of the scanning signals have been generated by the microcomputer 75a. If all the scanning signals have been generated, the control is terminated, and if not, the control jumps to step S70.

As shown again in FIG. 7B, the control proceeds to step S76, the key map information related to the key matrix 55 and 65 is converted into a scan code of the pressed key using the combined key map of FIG. 5. At step S77, the thus converted scan code is delivered to the main computer 70. Next, at step S78, it is determined whether or not all of the scan output lines have been checked. If so, the control is terminated, and if not, the control jumps to step S70.

Thus, the present invention provides the advantage of a computer, which can reduce its cost by using a keyboard free from a keyboard controller consisting of a microcomputer or a microprocessor.

As described above, in a keyboard of the present invention, because separated key matrices therein are connected independently to a microcomputer provided in a computer system, the keyboard has no need to use a matrix cable for connecting the separated key matrices to each other, in addition to a keyboard controller. Therefore, the keyboard has a more simplified structure. Specifically, the keyboard of the present invention is not provided with a keyboard controller therein for generating a scanning signal and for receiving a key input signal so as to recognize a key entry, but can use a microcomputer embodied in a computer system, so that a product cost of the keyboard can be considerably reduced.

Also, the keyboard is suitable for, and mounted easily on a portable computer because of its simplified structure.

While there have been illustrated and described what is to be considered the preferred embodiment of the present invention, it will be understood by those skilled in the art that various changes and modifications may be made, and equivalents may be substituted for elements thereof without departing from the true scope of the present invention. In addition, many modifications may be made to adapt a particular situation to the reaching of the present invention without departing from the scope thereof. Therefore, it is understood that the present invention is not limited to the particular embodiments disclosed as the best mode contemplated for carrying out the present invention, but embodiments falling within the scope of the appended claims.

What is claimed is:

1. A keyboard of a main computer, comprising:
   first and second keyboard frames of said keyboard separated from each other, said keyboard connected to a main computer having a microcomputer performing data processing functions of the main computer, the microcomputer having a key map being implemented therein and generating first and second scanning signals via respective scan output lines and receiving one of first or second return address signals via respective scan input lines upon a key on said keyboard being operated;
   a first key matrix assigned to said first keyboard frame and disposed adjacent to said first keyboard frame, said first key matrix generating said first return address signal on the first scan input line in response to said first scanning signal on the first scan output line; and
   a second key matrix assigned to said second keyboard frame and disposed adjacent to said second keyboard frame, said second key matrix generating said second return address signal on the scan input line in response to said second scanning signal on the scan output line.

2. The keyboard of claim 1, with said first key matrix not having a communication line directly connecting to said second key matrix.

3. The keyboard of claim 2, with said communication line being a matrix cable, the matrix cable being used to transfer scanning signals from the first key matrix to the second key matrix.

4. The keyboard of claim 3, with the microcomputer generating a scan code by implementing the key map to the return address signal.

5. A computer system, comprising:
a main body performing a data processing function;
a keyboard receiving a key input signal;
a microcomputer being contained within said main body, said microcomputer implementing a key map and generating first and second scanning signals via respective scan output lines and receiving one of first or second return address signals via respective scan input lines upon a key on said keyboard being operated, said microcomputer performing the data processing function; and
said keyboard comprising:
a first keyboard frame and a second keyboard frame separated from each other; and
a first key matrix and a second key matrix respectively assigned to said first and second keyboard frames and respectively disposed adjacent thereto, said first key matrix and second key matrix respectively generating said first and second return address signals in response to said first and second scanning signals.

6. The computer system of claim 5, with said first key matrix not having a communication line directly connecting to said second key matrix.

7. The computer system of claim 6, with the microcomputer generating a scan code by implementing the key map to the return address signal.

8. A keyboard of a main computer, comprising:
first through N keyboard frames of said keyboard separated from each other, said keyboard connected to a main computer having a microcomputer performing data processing functions of the main computer, the microcomputer having a key map being implemented therein and generating first through N scanning signals via respective scan output lines and receiving one of first through N return address signals via respective scan input lines upon a key on said keyboard being operated, being a positive integer greater than 1; and
first through N key matrices respectively assigned to said first through N keyboard frames and respectively disposed adjacent to said first through N keyboard frames, said first N key matrices generating said first through N return address signals in response to said first through N scanning signals.

9. The keyboard of claim 8, with said first key matrix not having a communication line connecting to said second key matrix, the communication line being used to transfer scanning signals from one key matrix to the other key matrix.

10. A computer system comprising:
a main body performing a data processing function;
a keyboard receiving a key input signal;
a microcomputer being contained within said main body, said microcomputer implementing a key map and generating first through N scanning signals via respective scan output lines and receiving one of first through N return address signals via respective scan input lines upon a key on said keyboard being operated, N being an integer greater than 1, said microcomputer performing the data processing function of the main body; and
said keyboard comprising:
first through N keyboard frames separated from each other; and
first through N key matrices respectively assigned to said first through N keyboard frames and respectively disposed adjacent to said first through N keyboard frames, said first through N key matrices respectively generating said first through N return address signals in response to said first through N scanning signals.

11. The computer system of claim 10 with said first through N key matrices not having a communication line directly connecting to any other first through N key matrices.

12. A method, comprising the steps of:
providing the first scanning signal output by a microcomputer to a first key matrix of a keyboard through a scan output line connected therewith, the keyboard connected to the main computer having the microcomputer having first and second key maps and a combined key map being stored therein and generating first and second scanning signals and receiving one of the first and second scanning signals upon a key on said keyboard being operated, the keyboard having first and second separated keyboard frames and first and second key matrices connected to the microcomputer through scan input and output lines, the first and second key matrices respectively disposed corresponding to the first and second keyboard frames, said microcomputer also performing data processing functions of the main computer;
checking the presence of the first scanning signal on a scan input line connected to the first key matrix;
determining first key map information concerning a key on the first key matrix being operated using the first key map;
providing the second scanning signal output by the microcomputer to the second key matrix through a scan output line connected therewith;
checking for the presence of the second scanning signal on the scan input line connected to the second key matrix;
determining second key map information concerning a key on the second key matrix being operated using the second key map;
converting the first and second key map information into a scanning code of the key being operated using the combined key map; and
outputting scanning code to the main computer.

13. The method of claim 12, with said first key matrix not having a communication line directly connecting to said second key matrix.

* * * * *